United States Patent [19]

Heidtmann et al.

[11] Patent Number: 4,916,306

[45] Date of Patent: Apr. 10, 1990

[54] DEVICE FOR DETECTING SPATIAL VARIATION IN THE INTENSITY OF ELECTROMAGNETIC RADIATION

[75] Inventors: Denis L. Heidtmann, Portland; Morley M. Blouke, Beaverton, both of Oreg.

[73] Assignee: Tektronix, Beaverton, Oreg.

[21] Appl. No.: 219,024

[22] Filed: Jul. 14, 1988

[51] Int. Cl.⁴ .................. H01L 27/14; H01L 31/06
[52] U.S. Cl. ..................... 250/211 J; 250/578.1; 357/24; 357/30
[58] Field of Search ............. 250/211 J, 211 R, 578; 357/24 LR, 30 D, 30 G, 30 H, 30 Q, 30 R; 377/60-63

[56] References Cited

U.S. PATENT DOCUMENTS

| | | | |
|---|---|---|---|
| 4,241,358 | 12/1980 | Wade | 357/30 G |
| 4,389,661 | 6/1983 | Yamada | 357/24 LR |
| 4,796,072 | 1/1989 | Higashi et al. | 250/211 J |

Primary Examiner—Edward P. Westin
Attorney, Agent, or Firm—John D. Winkelman; John Smith-Hill

[57] ABSTRACT

A device for detecting spatial variation in the intensity of electromagnetic radiation in a given spectral region comprises a body of semiconductor material that responds to electromagnetic radiation in the given spectral region by generating charge carriers. The body of semiconductor material has first and second charge collection regions separated by a barrier region that forms a potential barrier to the charge carriers in the charge collection regions. The device also comprises an electrode structure for establishing a predetermined potential in the charge collection regions, whereby charge carriers can be accumulated in the charge collection regions, and first and second output devices connected to the first and second charge collection regions respectively for extracting charge therefrom.

23 Claims, 2 Drawing Sheets

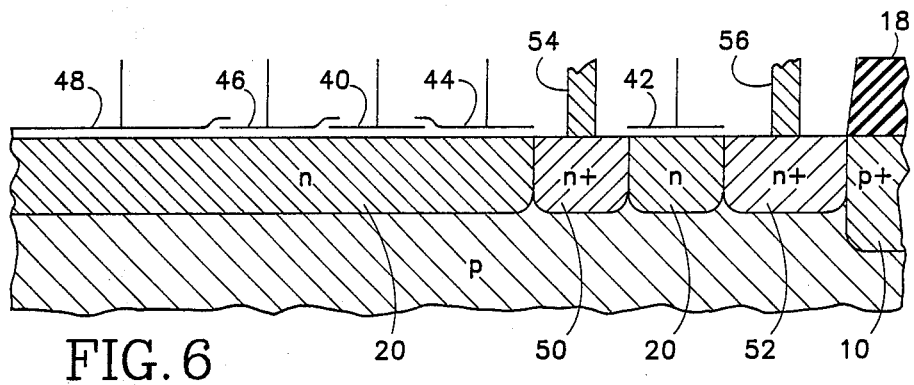
FIG. 6
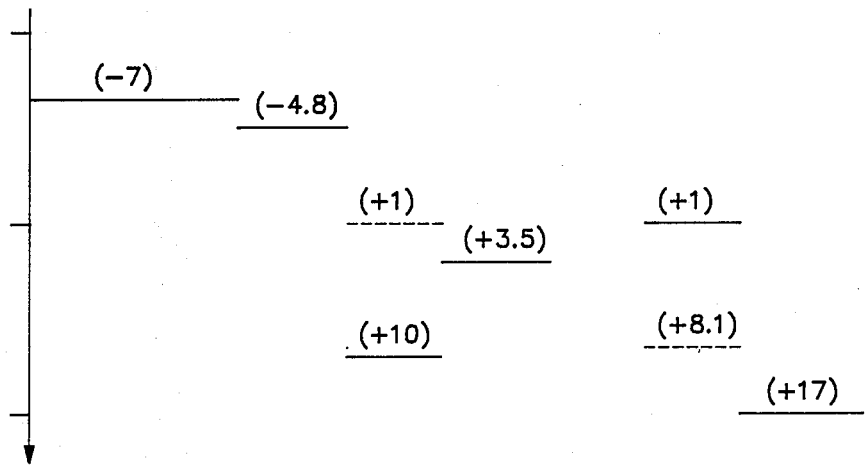
FIG. 7
TRANSFER
RESET
FIG. 8
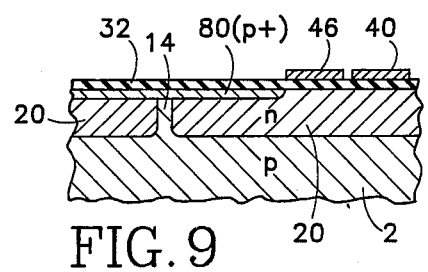
FIG. 9

DEVICE FOR DETECTING SPATIAL VARIATION IN THE INTENSITY OF ELECTROMAGNETIC RADIATION

BACKGROUND OF THE INVENTION

This invention relates to a device for detecting spatial variation in the intensity of electromagnetic radiation.

A quadrant detector that comprises four photodiodes, fabricated in a single die and equiangularly distributed about a central axis, may be used for positioning an object relative to a light source. The quadrant detector is mounted on the object so when the object is in the desired orientation, the light source is imaged on the detector and the four diodes provide equal currents. If the orientation of the object changes, at least two of the photocurrents will be different from each other and the resulting error signal may be used in a feedback loop to adjust the orientation of the object in a manner such as to achieve equality of the four photocurrents. Conventional quadrant detectors of this kind are not suitable for positioning an object relative to a faint light source. For example, such a quadrant detector could not readily be used to position a spacecraft relative to a star. The reason for this is that the energy flux received by the detector is so small that the photocurrents provided by the four diodes are subject to substantial and essentially random variations in relative magnitude, and therefore the instantaneous value of an error signal is not a reliable indication of the error in orientation of the spacecraft.

It is known to use an imaging charge-coupled device (CCD) to generate an electrical signal representative of the intensity with which light is incident on the device. One form of imaging CCD comprises a silicon die that has been processed using conventional MOS technology to form a buried channel beneath its front surface (the surface through which the die is processed). Charges are generated in the die photoelectrically. Thus, if photons enter the die, conduction electrons may be generated and these conduction electrons may enter the buried channel. By controlling clock signals that are applied to a gate electrode structure of the CCD, the charge that enters the buried channel may be confined in the channel for a substantial period. Accumulated charge may be extracted from the buried channel by application of suitable clock signals to the gate electrode structure.

SUMMARY OF THE INVENTION

A preferred embodiment of the present invention in a first aspect is a device for sensing spatial variation in the intensity of electromagnetic radiation in a given spectral region. The device comprises a body of semiconductor material that responds to electromagnetic radiation in the given spectral region by generating charge carriers. The body of semiconductor material has first and second charge collection regions separated by a region that forms a potential barrier to charge carriers in the charge collection regions. A predetermined potential is established in the charge collection regions, whereby charge carriers can be accumulated in the charge collection regions. The device also comprises first and second output devices connected to the first and second charge collection regions respectively for extracting charge therefrom.

A preferred embodiment of the invention in a second aspect is a device for sensing spatial variation in the intensity of electromagnetic radiation in a given spectral region. The device comprises a body of semiconductor material that responds to electromagnetic radiation in that spectral region by generating charge carriers. The body of semiconductor material has four charge collection regions, the first and second charge collection regions being separated from the third and fourth charge collection regions by a first barrier region and the first and third charge collection regions being separated from the second and fourth charge collection regions by a second barrier region. The conductivities of the charge collection regions and the barrier regions are such that the barrier regions form a potential barrier to charge carriers in the charge collection regions. A predetermined potential is established in the charge collection regions, whereby charge carriers can be accumulated in the charge collection regions. First, second, third and fourth output devices are connected respectively to the first, second, third and fourth charge collection regions, for extracting charge therefrom.

A preferred embodiment of the invention in a third aspect is a device for detecting spatial variation in the intensity of electromagnetic radiation in a given spectral region, comprising first and second charge collection volumes of semiconductor material that responds to electromagnetic radiation in that spectral region by generating charge carriers. The first and second charge collection volumes are isolated from each other with respect to diffusion of charge carriers. A predetermined potential is established in the charge collection volumes, whereby charge carriers can be accumulated in the charge collection volumes. First and second output devices are connected to the first and second charge collection volumes respectively for extracting charge therefrom.

BRIEF DESCRIPTION OF THE DRAWINGS

For a better understanding of the invention, and to show how the same may be carried into effect, reference will now be made, by way of example, to the accompanying drawings in which:

FIG. 6 is an enlarged schematic partial sectional view of the completed quadrant detector, FIG. 7 represents the channel potential beneath various electrodes of the quadrant detector at the gate bias levels indicated in parentheses, FIG. 8 is a timing diagram illustrating the waveforms of the potentials applied to two of the electrodes, and FIG. 9 is an enlarged partial sectional view of a second CCD quadrant detector embodying the present invention.

DETAILED DESCRIPTION

Figure 2:
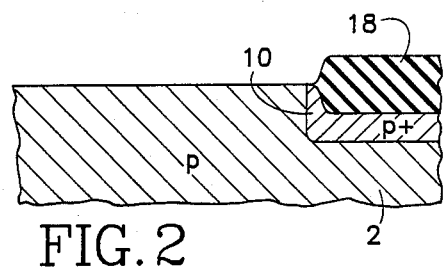
FIG. 2 is an enlarged sectional view of the quadrant detector taken on the line A—A of FIG. 1 prior to completing fabrication of the quadrant detector.
Figure 1:
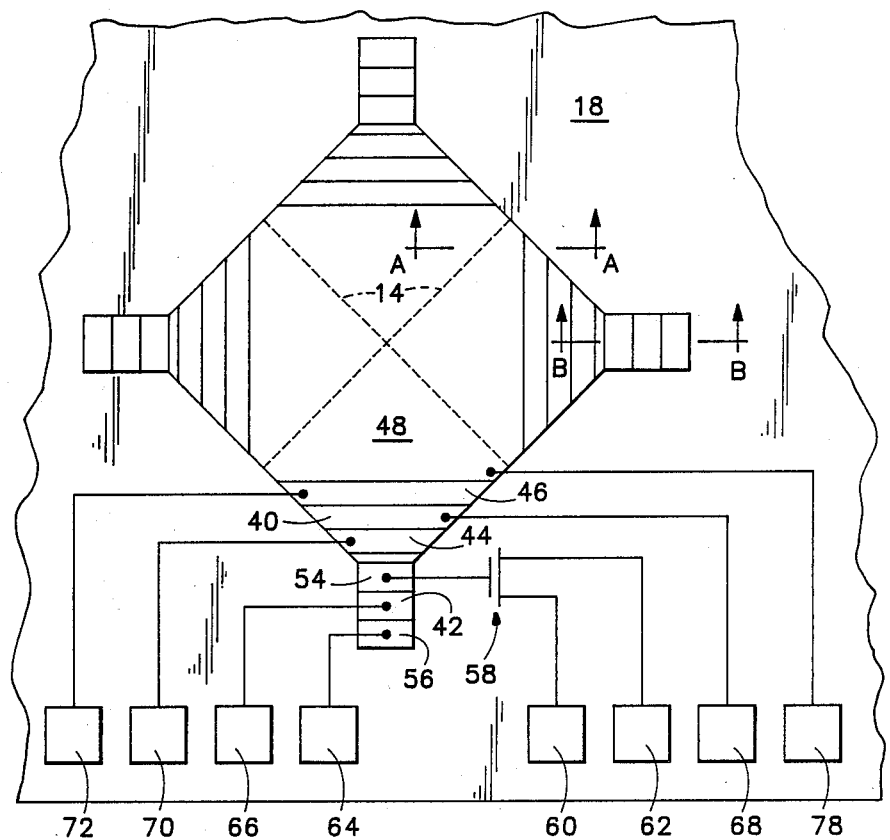
FIG. 1 is a top plan view of a CCD quadrant detector embodying the present invention.

The quadrant detector illustrated in FIG. 1 is fabricated on a single monocrystalline die 2 of p-type silicon. Since the die is monocrystalline, the crystal planes at any region of the die are parallel to or coplanar with the crystal planes at every other region of the die. As shown in FIG. 2, in a first implantation operation, a peripheral channel stop of p+ conductivity is formed in the die. The peripheral channel stop 10 surrounds what will ultimately be the active area of the die. The active area of the die is generally rectangular. A thick oxide layer 18 is thermally grown over the field area of the die (the area that is outside the active area). In a second implantation operation, n-type impurity ions are introduced into the active area. An implantation mask (not shown) prevents impurity ions from being introduced into two strip-form regions 14 of the active area of the die. The strip-form regions 14 are disposed at right angles to each other, and each divides the active area of the die in two. Accordingly, the second implantation results in the formation of four buried channel regions 20 in the active area. The four buried channel regions 20 are identical and are isolated from each other by the regions 14, which constitute channel stops.

Figure 4:
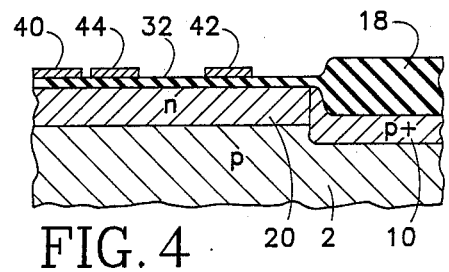
FIG. 4 is an enlarged sectional view of the quadrant detector taken on the line B—B of FIG. 1, prior to completing fabrication of the quadrant detector but at a later stage than that shown in FIG. 3.
Figure 3:
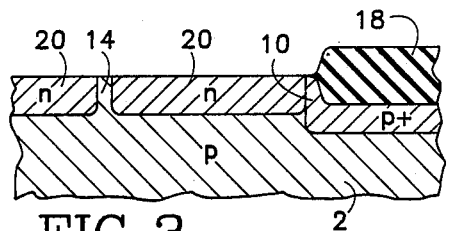
FIG. 3 is a view similar to FIG. 2 taken at a later stage in fabrication of the quadrant detector.
Figure 5:
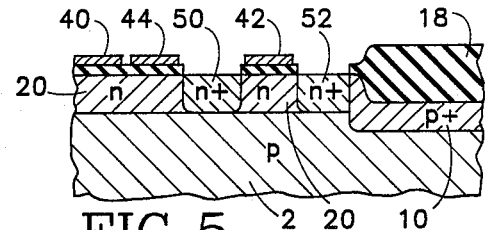
FIG. 5 is a view similar to FIG. 4 taken at a later stage in fabrication of the quadrant detector.

A thin layer 32 of silicon dioxide is thermally grown over the active area, and polysilicon electrodes 40–48 are formed over the oxide layer 32 in the active area. The electrodes are shown in FIG. 4 as lying in common plane, but in fact they are applied in three layers and the second and third layers overlap the first and second layers respectively as shown in FIG. 6. (The oxide layer 32 is not shown in FIG. 6.) After the electrodes 40–48 have been formed, the thin oxide layer 32 is partially removed, exposing the die 2, as shown in FIG. 5, and an open tube diffusion takes place. In the open tube diffusion, n-type impurity ions are introduced into the polysilicon electrodes and into the parts of the buried channel region that have been exposed by removal of the oxide layer 32. In this manner, the conductivity of the polysilicon electrodes is increased and a floating diffusion 50 and an output diffusion 52 are formed in each region of the active area. Metal contacts 54 and 56 (FIG. 6) are applied to these diffusions. The metal contact 54 is connected to the gate of a field effect transistor 58, which is shown only schematically in FIG. 1 and whose source and drain are connected to respective bonding pads 60 and 62 at the periphery of the die. The metal contact 56 is connected to a bonding pad 64.

A potential well is defined in the channel beneath each electrode, with the energetic depth of the well depending on the potential of the electrode. The first layer polysilicon electrodes 40 and 42 constitute a transfer gate and a reset gate. The reset gate is positioned over the portion of the buried channel that lies between the output diffusion 52 and the floating diffusion 50. The four reset gates are connected together (these connections are not shown in FIG. 1) and are connected to a bonding pad 66 at the periphery of the die. Similarly, the four transfer gates are connected together and are connected to a bonding pad 68. The second layer polysilicon electrodes 44 and 46 constitute a last gate, which lies over the portion of the buried channel between the floating diffusion and the portion that lies under the transfer gate, and a store gate, which lies on the opposite side of the transfer gate from the last gate. The four last gates are connected to a common bonding pad 70, and the four store gates are connected to a common bonding pad 72. The third layer polysilicon electrode 48 is a single sense electrode, which covers the entire area of the buried channel that is bounded by the peripheral channel stop 10 and the portions that lie under the store gates. The sense electrode 48 extends over the internal channel stops 14 and is connected to a bonding pad 78. The p-type substrate of the die is connected to a further bonding pad (not shown).

FIG. 7 illustrates graphically the relationships among the channel potentials that exist under the various polysilicon electrodes during operation of the quadrant detector. The horizontal lines in FIG. 7 represent the channel potentials under the electrodes that are vertically aligned with these lines in FIG. 6. The parenthetical numbers represent, by way of example only, the voltages applied to the electrodes. The vertical scale at the left of FIG. 7 indicates the channel potential. Thus, when the store gate 46 is at a potential of −4.8 v (relative to the substrate), the channel potential beneath the store electrode is about +5 v.

In operation of the quadrant detector, the die 2 is positioned so that a light source is imaged on the front surface of the die, over its active area. Photons enter the die and conduction electrons are generated photoelectrically in the die. Some of the conduction electrons are generated in the buried channel region while some that are generated in the p-type substrate diffuse into the buried channel region. The sense electrode 48 is held at a constant negative potential relative to the p-type substrate. The negative voltage is selected to be sufficiently large to cause an inversion at the surface of the die. The surface is thereby pinned, i.e. held at a substantially constant potential (relative to the substrate). By selecting an appropriate negative potential for the sense electrode, e.g. −7 v, the surface potential of the die beneath the sense electrode is established at essentially the same potential as the substrate. At greater depths within the portion of the buried channel that is beneath the sense electrode, higher potentials exist and accordingly electrons in the buried channel region are repelled from the surface of the die. In addition, the inversion creates a thin layer of holes immediately beneath the surface of the die, and this layer isolates the buried channel from the surface. Dark current, caused by surface states in the buried channel region, is therefore eliminated.

In preparation for carrying out a measurement, the store, transfer and last gates may be sequentially clocked positive in order to remove charge from the sense well (the portion of the buried channel region that is beneath the sense electrode). At the start of an integration period, the store gate is placed at a potential that is slightly positive relative to the sense electrode (−4.8 v) while the transfer electrode is placed at a high positive potential (+10 v). The last gate is at a potential intermediate that of the store gate and transfer gate (+3.5 v) while the reset gate is at a lower potential than the last gate (+1 v). Conduction electrons that are generated in or enter the buried channel region beneath the sense electrode are attracted into the transfer well. Just before the end of the integration period, the reset gate is clocked to +8.1 v, and accordingly a conductive channel is established between the output diffusion 52 and the floating diffusion 50. The floating diffusion is thus brought to the same potential as the output diffusion. The reset gate is then returned to +1 v, breaking the conductive channel. Then, at the end of the integration period, the transfer gate 40 is clocked to a potential between that of the last gate 44 and that of the store gate 46 (+1 v), and accordingly charge that had accumulated in the transfer well passes into the last well, and is applied to the gate of the transistor 58 by way of the floating diffusion 50. When sufficient time has elapsed to ensure that the charge present in the transfer well has been applied to the gate of the transistor, the transfer gate is again clocked positive and a new integration period starts.

Since the sense electrode is the only electrode in the third polysilicon layer and is not clocked, and therefore does not pass current, the third layer of polysilicon can be made very thin, for enhanced quantum efficiency. Moreover, since the four regions of the active area are separated by channel stops instead of being fabricated on separate die, the entire area within the boundary defined by the peripheral channel stop is sensitive to electromagnetic radiation.

Attention is directed to U.S. patent application No. 219,954 filed concurrently herewith, which also discloses a device for detecting spatial variation in the inensity of electromagnetic radiation.

It will be appreciated that the present invention is not restricted to the particular embodiment that has been described and illustrated, and that variations may be made therein without departing from the scope of the invention as defined in the appended claims and equivalents thereof. For example, the store gate is not essential to operation of the described embodiment, but by appropriate selection of the potentials applied to the various gates, the charge may be collected in the store well instead of in the transfer well. At the end of the integration period, the transfer gate is driven more positive than the store gate and the last gate is driven yet more positive, so that the charge is shifted from the store well to the transfer well and from there to the last well. Also, the third polysilicon layer is not essential, and its effect may be provided by a very shallow doping of the charge collection regions with a p-type impurity to form a thin layer 80 of p+ conductivity, as shown in FIG. 9. This p+ layer, which extends over the channel stops 14 and therefore is connected to the substrate potential, pins the channel potential in the charge collection regions at a value that is positive relative to the substrate potential. It is not necessary to illuminate the detector through its front surface if the die is thinned, e.g., in the manner described in co-pending patent application Ser. No. 07/018,832, filed Feb. 24, 1987. It will be appreciated that the potential levels that are referred to are given by way of example only.

We claim:

1. A device for detecting spatial variation in the intensity of electromagnetic radiation in a given spectral region, comprising:
    a body of semiconductor material that responds to electromagnetic radiation in said given spectral region by generating charge carriers, the body of semiconductor material having first and second charge collection regions separated by a barrier region that forms a potential barrier to the charge carriers in the charge collection regions,
    electrode means that overlie the charge collection regions for establishing a predetermined potential in the charge collection regions, whereby charge carriers can be accumulated in the charge collection regions, the electrode means including at least a sense electrode that overlies part of both the first and second charge collection regions, and at least first and second gates that overlie other parts of the first and second charge collection regions respectively, the first and second gates being connected together and being electrically isolated from the sense electrode, whereby the first and second gate can be maintained at a different potential from the sense electrode, and
    first and second output devices connected to said first and second charge collection regions respectively for extracting charge therefrom, said first and second output devices being adjacent to said other parts of the first and second charge collections respectively.

2. A device according to claim 1, wherein the first and second charge collection regions are of a first conductivity type and the barrier region is of a second, opposite conductivity type.

3. A device according to claim 1, wherein the first and second output devices comprise respective floating diffusion amplifiers.

4. A device for detecting spatial variation in the intensity of electromagnetic radiation in a given spectral region, comprising:
    a body of semiconductor material that responds to electromagnetic radiation in said given spectral region by generating charge carriers, the body of semiconductor material comprising a substrate of p-type conductivity having first and second charge collection regions of n-type conductivity separated by a barrier region that forms a potential barrier to the charge carriers in the charge collection regions,
    a layer of p+ conductivity overlying at least part of each of the charge collection regions for establishing a predetermined potential in the charge collection regions, whereby charge carriers can be accumulated in the charge collection regions, and
    first and second output devices connected to said first and second charge collection regions respectively for extracting charge therefrom.

5. A device according to claim 4, wherein the first and second charge collection regions are of a first conductivity type and the barrier region is of a second, opposite conductivity type.

6. A device according to claim 4, wherein the barrier region is of p-type conductivity.

7. A device according to claim 4, wherein the first and second output devices comprise respective floating diffusion amplifiers.

8. A device for sensing spatial variation in the intensity of electromagnetic radiation in a given spectral region, comprising:
    a body of semiconductor material that responds to electromagnetic radiation in said given spectral region by generating charge carriers, the body of semiconductor material having first, second, third and fourth charge collection regions, the first and second charge collection regions being separated from the third and fourth charge collection regions by a first barrier region and the first and third charge collection regions being separated from the second and fourth charge collection regions by a second barrier region, the conductivities of the charge collection regions and the barrier regions being such that the barrier regions form potential barriers to charge carriers in the charge collection regions,
    means for establishing a predetermined potential in the four charge collection regions, whereby charge carriers can be accumulated in the four charge collection regions, and first, second, third and fourth output devices connected respectively to the first, second, third and fourth charge collection regions for extracting charge therefrom.

9. A device according to claim 8, wherein the first, second, third and fourth charge collection regions are of a first conductivity type and the barrier region is of a second, opposite conductivity type.

10. A device according to claim 8, wherein the means for establishing a predetermined potential in the charge collection regions comprise electrode means that overlie the charge collection regions.

11. A device according to claim 10, wherein the electrode means include at least a sense electrode that overlies part of each of the four charge collection regions, and four gates that overlie other parts of the four charge collection regions respectively, which other parts are adjacent the four output devices respectively, the four gates being connected together and being electrically isolated from the sense electrode, whereby the gates can be maintained at a different potential from the sense electrode.

12. A device according to claim 8, wherein the body of semiconductor material comprises a substrate of p-type conductivity, the charge collection regions are of n-type conductivity and the means for establishing a predetermined potential in the charge collection regions comprise a layer of p+ conductivity overlying at least part of each of the four charge collection regions.

13. A device according to claim 12, wherein the barrier region is of p-type conductivity.

14. A device according to claim 8, wherein the output devices comprise respective floating diffusion amplifiers.

15. A device according to claim 8, wherein the two barrier regions are rectilinear and are disposed substantially perpendicular to each other in intersecting relationship, whereby the four charge collector regions are distributed substantially equiangularly about the intersection of the two barrier regions.

16. A device for detecting spatial variation in the intensity of electromagnetic radiation in a given spectral region, comprising:

a body of semiconductor material that responds to electromagnetic radiation in said given spectral region by generating charge carriers, said body comprising a substrate of p-type conductivity and first and second charge collection volumes of n-type conductivity, the first and second charge collection volumes being isolated from each other with respect to diffusion of charge carriers, a layer of p+ conductivity overlying at least part of each of the charge collection volumes for establishing a predetermined potential in the charge collection volumes, whereby charge carriers can be accumulated in the charge collection volumes, and first and second output devices connected to said first and second charge collection volumes respectively for extracting charge therefrom.

17. A device according to claim 16, wherein the semiconductor material is crystalline and has crystal planes in the first charge collection volume that are parallel to or coincide with crystal planes in the second charge collection volume.

18. A device for detecting spatial variation in the intensity of electromagnetic radiation in a given spectral region, comprising:

a body of semiconductor material that responds to electromagnetic radiation in said given spectral region by generating charge carriers, the body of semiconductor material having first and second charge collection regions separated by a barrier region that forms a potential barrier to the charge carriers in the charge collection regions, means for establishing a predetermined potential in the charge collection regions, whereby charge carriers can be accumulated in the charge collection regions, and first and second floating diffusion amplifiers connected to said first and second charge collection regions respectively for extracting charge therefrom.

19. A device according to claim 18, wherein the first and second charge collection regions are of a first conductivity type and the barrier region is of a second, opposite conductivity type.

20. A device according to claim 18, wherein the means for establishing a predetermined potential in the charge collection regions comprise electrode means that overlie the charge collection regions.

21. A device according to claim 20, wherein the electrode means include at least a sense electrode that overlies part of both the first and second charge collection regions, and at least first and second gates that overlie other parts of the first and second charge collection regions respectively, which other parts are adjacent to the first and second floating diffusion amplifiers respectively, the first and second gates being connected together and being electrically isolated from the sense electrode, whereby the first and second gates can be maintained at a different potential from the sense electrode.

22. A device according to claim 18, wherein the body of semiconductor material comprises a substrate of p-type conductivity, the charge collection regions are of n-type conductivity and the means for establishing a predetermined potential in the charge collection regions comprise a layer of p+ conductivity overlying at least part of each of the charge collection regions.

23. A device according to claim 22, wherein the barrier region is of p-type conductivity.

* * * * *